United States Patent
Zhang

(10) Patent No.: US 12,198,960 B2
(45) Date of Patent: Jan. 14, 2025

(54) SYSTEM AND METHOD FOR ADJUSTING OXYGEN CONTENT IN FRONT OPENING UNIFIED POD

(71) Applicant: CHANGXIN MEMORY TECHNOLOGIES, INC., Hefei (CN)

(72) Inventor: Dapeng Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 490 days.

(21) Appl. No.: 17/519,611

(22) Filed: Nov. 5, 2021

(65) Prior Publication Data
US 2023/0028319 A1    Jan. 26, 2023

Related U.S. Application Data

(63) Continuation of application No. PCT/CN2021/116916, filed on Sep. 7, 2021.

(30) Foreign Application Priority Data

Jul. 26, 2021 (CN) .......................... 202110846065.8

(51) Int. Cl.
*H01L 21/673* (2006.01)
*G05D 11/13* (2006.01)

(52) U.S. Cl.
CPC ...... *H01L 21/67389* (2013.01); *G05D 11/138* (2013.01)

(58) Field of Classification Search
CPC .................. H01L 21/67017; H01L 21/67393
See application file for complete search history.

(56) References Cited

U.S. PATENT DOCUMENTS

| | | | |
|---|---|---|---|
| 2014/0112739 A1* | 4/2014 | Hirano | C23C 16/4408 414/217.1 |
| 2017/0170044 A1* | 6/2017 | Okabe | H01L 21/67017 |
| 2019/0035660 A1* | 1/2019 | Lin | H01L 21/67393 |
| 2020/0227295 A1* | 7/2020 | Murata | B65G 1/00 |

FOREIGN PATENT DOCUMENTS

| | | |
|---|---|---|
| CN | 109782701 A | 5/2019 |
| CN | 111192844 A | 5/2020 |
| CN | 212676231 U | 3/2021 |
| JP | 2009049286 A | 3/2009 |
| TW | M565397 U | 8/2018 |
| TW | M605384 U | 12/2020 |
| TW | M607111 U | 2/2021 |

* cited by examiner

*Primary Examiner* — Timothy P. Kelly
(74) *Attorney, Agent, or Firm* — Kilpatrick Townsend & Stockton LLP

(57) ABSTRACT

Embodiments of the disclosure provide a system and method for adjusting an oxygen content in an FOUP. The system for adjusting the oxygen content in the FOUP includes an inflating assembly, the FOUP, a controller and a detecting assembly; the inflating assembly is connected with a gas inlet of the FOUP and configured to input an inert gas to the FOUP; the detecting assembly is connected with a gas outlet of the FOUP and configured to detect the oxygen content of the gas in the FOUP; and the inflating assembly and the detecting assembly are both connected with the controller, and the controller is configured to adjust a flow of the inert gas input from the inflating assembly to the FOUP according to the oxygen content detected by the detecting assembly.

10 Claims, 7 Drawing Sheets

SYSTEM AND METHOD FOR ADJUSTING OXYGEN CONTENT IN FRONT OPENING UNIFIED POD

CROSS-REFERENCE TO RELATED APPLICATIONS

This application is a U.S. continuation application of International Application No. PCT/CN2021/116916, filed on Sep. 7, 2021, which claims priority to Chinese patent application No. 202110846065.8, filed on Jul. 26, 2021. International Application No. PCT/CN2021/116916 and Chinese patent application No. 202110846065.8 are incorporated herein by reference in their entireties.

TECHNICAL FIELD

Embodiments of the disclosure relate to the technical field of semiconductors, and in particular to a system and method for adjusting an oxygen content in a Front Opening Unified Pod (FOUP).

BACKGROUND

With the increase of the labor cost and the increase of the intelligent and refined degree of production, an Automatic Material Handling System (AMHS) has been widely applied to the high-end manufacturing industry.

An FOUP is a container configured to protect, convey, and store wafers in the semiconductor manufacturing process. When the wafers contained in the FOUP cannot enter the next production procedure, the FOUP would be temporarily stored on an Over Head Buffer (OHB) by an Overhead Hoist Transfer (OHT) until it is available in the next procedure. Considering that circuits generated in a silicon-on production process are prone to being oxidized, the FOUP is usually inflated with inert gases such as nitrogen to lower the oxygen content in the FOUP.

However, in the related art, when the FOUP is temporarily stored on the OHB, the FOUP is inflated with the inert gases with a constant flow until there is an enough production space for process production in the next production procedure. During the inflation, it fails to guarantee that the oxygen content in the FOUP is lower than a safety value, and thus silicon wafers in the FOUP still have the risk of being oxidized. In addition, inflating the FOUP with inert gases for a long-time will cause waste of the inert gases, thereby increasing the production cost.

SUMMARY

Embodiments of the disclosure provide a system and method for adjusting an oxygen content in an FOUP, which can solve the technical problems that in the related art, it fails to guarantee that the oxygen content in the FOUP is lower than a safety value and inert gases inflated into the FOUP causes greater waste.

In some embodiments, the system for adjusting an oxygen content in an FOUP provided, includes an inflating assembly, the FOUP, a controller and a detecting assembly.

The inflating assembly is connected with a gas inlet of the FOUP, and is configured to input an inert gas to the FOUP.

The detecting assembly is connected with a gas outlet of the FOUP, and is configured to detect the oxygen content of the gas in the FOUP.

The inflating assembly and the detecting assembly are both connected with the controller, and the controller is configured to adjust a flow of the inert gas input to the FOUP by the inflating assembly according to the oxygen content detected by the detecting assembly.

In some embodiments, the method for adjusting an oxygen content in an FOUP provided is applied to a system for adjusting an oxygen content in an FOUP. The system for adjusting the oxygen content in the FOUP includes an inflating assembly, the FOUP and a detecting assembly. The inflating assembly is connected with a gas inlet of the FOUP, and is configured to input an inert gas to the FOUP. The detecting assembly is connected with a gas outlet of the FOUP, and is configured to detect the oxygen content of the gas in the FOUP.

The method includes the following operations.

The oxygen content detected by the detecting assembly is obtained.

A flow of the inert gas input to the FOUP by the inflating assembly is adjusted according to the oxygen content detected by the detecting assembly.

DETAILED DESCRIPTION

In order to make the objectives, technical solutions and advantages of embodiments of the disclosure clearer, the technical solutions in the embodiments of the disclosure are clearly and completely described below in combination with the drawings in the embodiments of the disclosure. It is apparent that the described embodiments are only part of, not all of, the embodiments of the disclosure. All other embodiments obtained by those of ordinary skill in the art based on the embodiments of the disclosure without creative efforts fall within the scope of protection of the disclosure. In addition, although the content disclosed in the disclosure is introduced according to one or several exemplary examples, it should be understood that various aspects of the disclosed content can also constitute a complete implementation independently.

It should be noted that the brief description of terms in the disclosure is only for ease of understanding of the implementations described below and is not intended to limit the implementations of the disclosure. Unless otherwise stated, these terms should be understood according to their ordinary and usual meaning.

In addition, the terms "include" and "have", as well as any variations thereof, are intended to cover but not exclusively such inclusion. For example, a product or device that includes a series of components is not necessarily limited to include those components expressly listed, but may include other components not expressly listed or inherent to such product or device.

Figure 1:
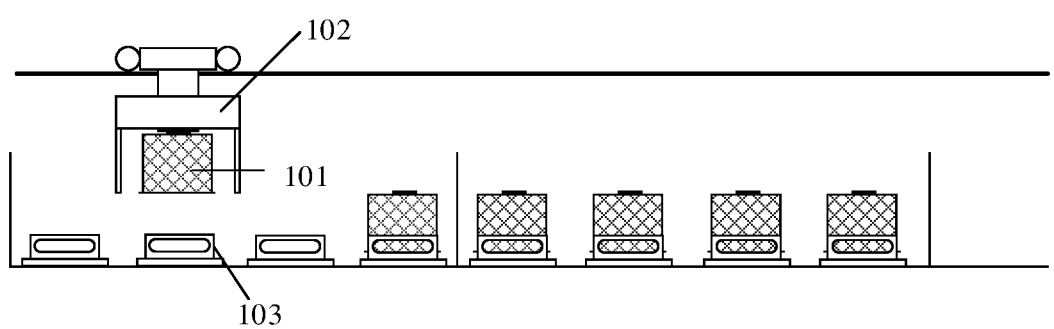
FIG. 1 schematically shows a structure of an automatic material handling system provided by an embodiment of the disclosure.

Referring to FIG. 1, it a schematically shows a structure of an Automatic Material Handling System (AMHS) provided by an embodiment of the disclosure.

In some embodiments, a Front Opening Unified Pod (FOUP) 101 is a container configured to protect, convey, and store wafers in the semiconductor manufacturing process. When the wafers contained in the FOUP 101 cannot enter the next production procedure, the FOUP 101 would be temporarily stored on an Overhead Hoist Transfer (OHT) 102 by an OverHead Buffer (OHB) 103 until it is available in the next procedure. Considering that circuits generated in a silicon-on production process are prone to being oxidized, the FOUP 101 is usually inflated with inert gases such as nitrogen to lower the oxygen content in the FOUP 101 and prolong the preservation time of silicon wafers in the FOUP 101.

However, in the related art, when the FOUP 101 is temporarily stored on the OHB 103, the FOUP 101 is inflated with the inert gases with a constant flow until there is an enough production space for process production in the next production procedure, and after that, the FOUP 101 enters the next production procedure. During that, it fails to guarantee that an oxygen content in the FOUP is lower than a safety value, and thus the silicon wafers in the FOUP still have the risk of being oxidized. In addition, inflating the FOUP with inert gases for a long-time will cause waste of the inert gases, thereby increasing the production cost.

In order to solve the above technical problems, embodiments of the disclosure provide a system and method for adjusting an oxygen content in an FOUP. A detecting assembly is arranged at a gas outlet of the FOUP and configured to detect the oxygen content of a gas in the FOUP, and meanwhile, a controller is further arranged and configured to adjust a flow of an inert gas input to the FOUP by an inflating assembly according to the oxygen content detected by the detecting assembly. That is, the flow of the inert gas input to the FOUP is not kept constant and is varied with the oxygen content of the gas in the FOUP. This not only can effectively ensure that the oxygen content in the FOUP is lower than a safety value and lower the risk of being oxidized of silicon wafers in the FOUP, but also can reduce the waste of the inert gas and thus lower the production cost.

Figure 2:
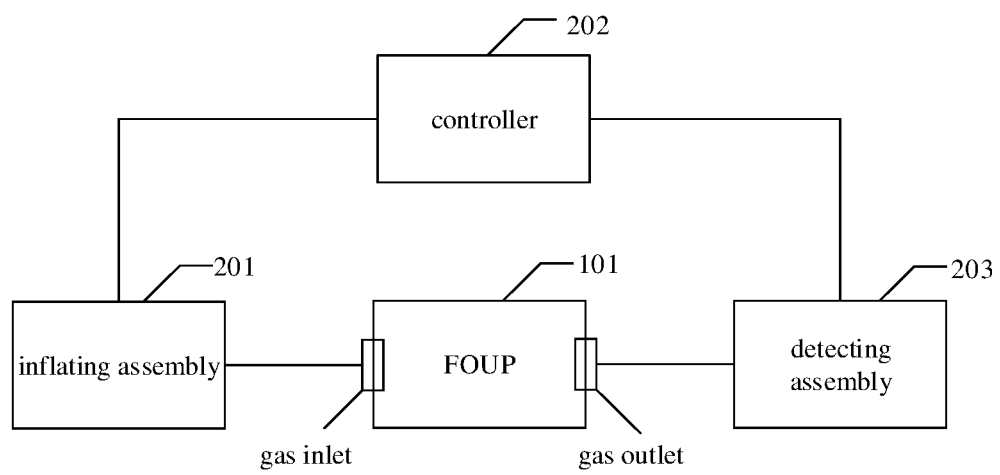
FIG. 2 schematically shows a structure of a system for adjusting an oxygen content in an FOUP provided by an embodiment of the disclosure.

Referring to FIG. 2, it schematically shows a structure of a system for adjusting an oxygen content in an FOUP provided by an embodiment of the disclosure.

In a feasible embodiment, the system for adjusting the oxygen content in the FOUP above includes an inflating assembly 201, the FOUP 101, a controller 202 and a detecting assembly 203.

The inflating assembly 201 is connected with a gas inlet of the FOUP 101, and the inflating assembly 201 is configured to input an inert gas to the FOUP 101.

Optionally, the inert gas above may be a gas that is difficult to react under a general condition, such as nitrogen ($N_2$), helium (He), neon (Ne), argon (Ar), krypton (Kr) and xenon (Xe), which is not limited in embodiments of the disclosure.

The detecting assembly 203 is connected with a gas outlet of the FOUP 101, and is configured to detect the oxygen content of the gas in the FOUP 101.

In a feasible embodiment, the detecting assembly 203 may have the function of drawing out the gas and the function of detecting an oxygen content. The oxygen content of the gas in the FOUP may be determined by drawing out the gas from the FOUP first and then detecting the oxygen content in the drawn-out gas.

The inflating assembly 201 and the detecting assembly 203 are both connected with the controller 202. The controller 202 is configured to adjust the flow of the inert gas input to the FOUP 101 by the inflating assembly 201 according to the oxygen content detected by the detecting assembly.

In a feasible embodiment, a feedback adjusting mechanism may be used in the controller 202 to adjust the flow of the inert gas input to the FOUP 101 by the inflating assembly 201.

Exemplarily, the higher the oxygen content of the gas in the FOUP 101 detected by the detecting assembly, the larger the flow of the inert gas input to the FOUP 101 by the inflating assembly 201 controlled by the controller 202. The lower the oxygen content of the gas in the FOUP 101 detected by the detecting assembly, the smaller the flow of the inert gas input to the FOUP 101 by the inflating assembly 201 controlled by the controller 202.

According to the system for adjusting the oxygen content in the FOUP provided by the embodiment of the disclosure, the detecting assembly is arranged at the gas outlet of the FOUP 101 and configured to detect the oxygen content of the gas in the FOUP 101. Meanwhile, the controller 202 is further arranged and configured to adjust the flow of the inert gas input to the FOUP 101 by the inflating assembly 201 according to the oxygen content detected by the detecting assembly 203. That is, in the embodiment of the disclosure, the flow of the inert gas input to the FOUP 101 is not kept constant and is varied with the oxygen content of the gas in the FOUP. This not only can effectively ensure that the oxygen content in the FOUP 101 is lower than a safety value and can lower the risk of being oxidized of silicon wafers in the FOUP 101, but also can reduce the waste of the inert gas and thus lower the production cost.

Based on the content described in the above embodiments, in a feasible embodiment of the disclosure, the controller 202 is specifically configured as follows.

a, obtaining the oxygen content detected by the detecting assembly 203.

b, determining an oxygen content range into which the oxygen content detected by the detecting assembly 203 falls.

c, determining a target flow value of the inert gas input to the FOUP by the inflating assembly according to the oxygen content range into which the oxygen content detected by the detecting assembly 203 falls, different oxygen content ranges correspond to different flow values.

d, adjusting the flow of the inert gas input to the FOUP by the inflating assembly 201 to the target flow value.

e, stopping the input of the inert gas to the FOUP 101 by controlling the inflating assembly 201 when the oxygen content detected by the detecting assembly 203 is lower than or equal to a preset threshold value of the oxygen content.

In other words, in the embodiments of the disclosure, a plurality of oxygen content ranges may be pre-set and each of the oxygen content ranges corresponds to a different flow value. After obtaining the oxygen content of the gas in the FOUP 101 detected by the detecting assembly 203, the controller 202 adjusts the flow of the inert gas input to the FOUP 101 by the inflating assembly 201 according to the oxygen content range in which the obtained oxygen content falls.

Figure 3:
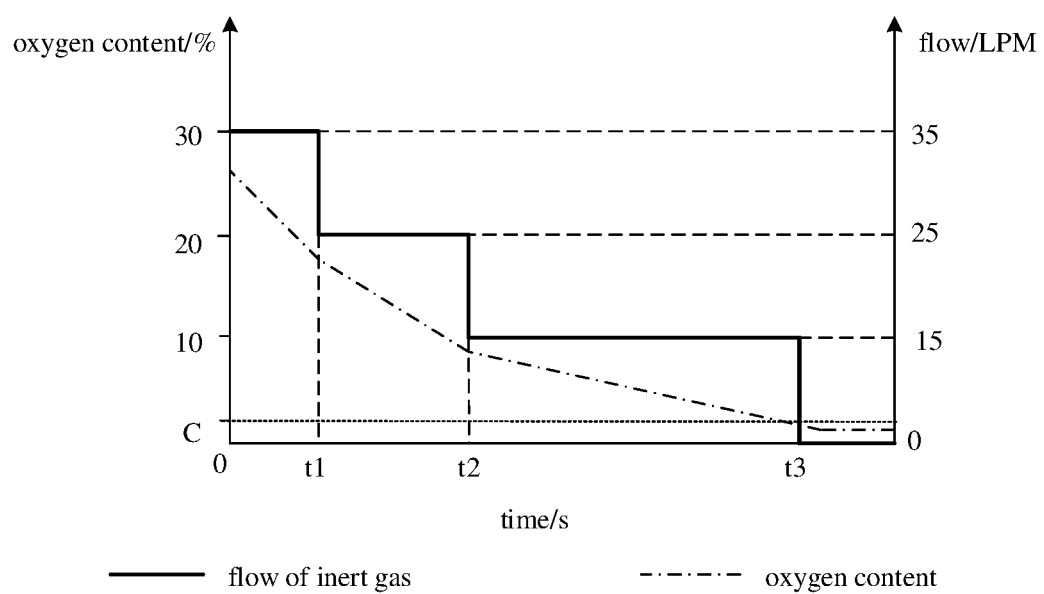
FIG. 3 schematically shows a curve for adjusting an oxygen content in an FOUP provided by an embodiment of the disclosure.

For better understanding of the embodiments of the disclosure, referring to FIG. 3, FIG. 3 schematically shows a curve for adjusting an oxygen content in the FOUP provided by the embodiment of the disclosure.

In FIG. 3, assuming that the oxygen content of the gas in the FOUP 101 falls into a range of 20% to 30% upon the detection of the detecting assembly 203 after an operation, the inflating assembly 201 would be controlled by the controller 202 to continuously input the inert gas to the FOUP 101 with a flow of 35 LPM.

At the time of reaching a moment t1, if the oxygen content of the gas in the FOUP 101 falls into a range of 10% to 20% upon the detection of the detecting assembly 203, the inflating assembly 201 would be controlled by the controller 202 to continuously input the inert gas to the FOUP 101 with a flow of 25 LPM.

At the time of reaching a moment t2, if the oxygen content of the gas in the FOUP 101 falls into a range of C % (the preset threshold value of oxygen content) to 10% upon the detection of the detecting assembly 203, the inflating assembly 201 would be controlled by the controller 202 to input the inert gas with a flow of 15 LPM.

At the time of reaching a moment t3, if the oxygen content of the gas in the FOUP 101 is lower than or equal to the preset threshold value of the oxygen content, i.e., C %, upon the detection of the detecting assembly 203, the inflating assembly 201 is controlled by the controller 202 to stop inputting the inert gas to the FOUP 101.

Optionally, the preset threshold value of the oxygen content, i.e., C %<1%.

Through the control means above, in the disclosure, different flows are set under different oxygen content ranges. The oxygen content of the gas in the FOUP 101 is adjusted in a staged mode, and thus not only can the oxygen content of the gas in the FOUP 101 be quickly lowered, but also the use amount of the inert gas can be effectively saved.

Based on the content described in the embodiment above, in other feasible embodiments of the disclosure, the controller 202 is specifically configured as follows.

a, obtaining the oxygen content detected by the detecting assembly 203.

b, determining whether the oxygen content detected by the detecting assembly 203 is greater than the preset threshold value of the oxygen content.

c, adjusting the flow of the inert gas input to the FOUP 101 by the inflating assembly 201 to a preset constant flow value when the oxygen content detected by the detecting assembly 203 is greater than the preset threshold value of the oxygen content.

d, controlling the inflating assembly 201 to stop inputting the inert gas to the FOUP 101 when the oxygen content of the gas in the FOUP 101 detected by the detecting assembly 203 is lower than or equal to the preset threshold value of the oxygen content after a period of time.

In other words, in the another feasible implementation of the disclosure, when the oxygen content detected by the detecting assembly 203 is greater than the preset threshold value of the oxygen content, the inputting of the inert gas by the inflating assembly 201 to the FOUP 101 may be controlled at the constant flow by the controller 20 until the oxygen content detected by the detecting assembly 203 is lower than or equal to the preset threshold value of the oxygen content, and then the inflating assembly 201 is controlled to stop inputting the inert gas to the FOUP 101, thereby effectively saving the use amount of the inert gas.

Based on the content described in the above embodiment, in a feasible embodiment of the disclosure, the controller 202 is further specifically configured as follows.

It is determined whether the oxygen content detected by the detecting assembly 203 is greater than the preset oxygen content threshold value every a preset duration after controlling the inflating assembly 201 to stop inputting the inert gas to the FOUP 101; and the inflating assembly 201 is controlled to input the inert gas to the FOUP 101 according to the oxygen content detected by the detecting assembly 203 if the oxygen content detected by the detecting assembly 203 is greater than the preset threshold value of the oxygen content.

Figure 4:
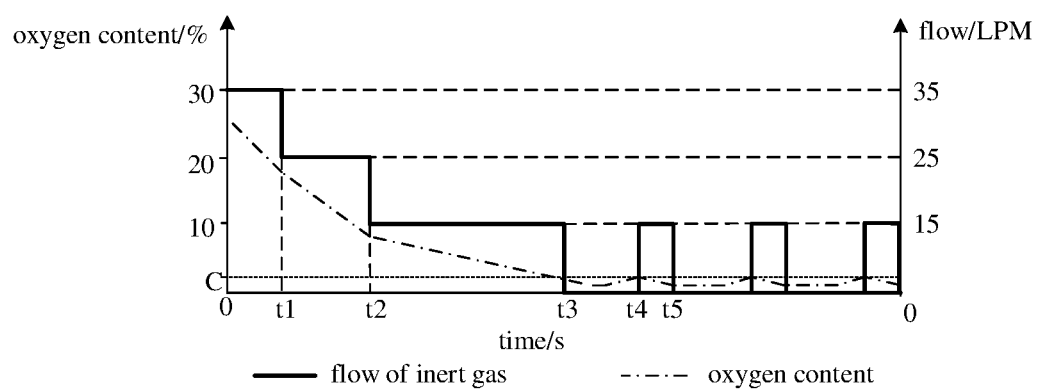
FIG. 4 schematically shows another curve for adjusting an oxygen content in an FOUP provided by an embodiment of the disclosure.

For better understanding of the embodiment of the disclosure, referring to FIG. 4, it schematically shows another curve for adjusting an oxygen content in the FOUP provided by the embodiment of the disclosure.

In FIG. 4, assuming that at the time of reaching a moment t3, if the oxygen content of the gas in the FOUP 101 detected by the detecting assembly 203 is lower than or equal to the preset oxygen content threshold value C %, the inflating assembly 201 would be controlled by the controller 202 at this time, to stop inputting the inert gas to the FOUP 101. After stopping the input of the inert gas to the FOUP 101 by the inflating assembly 201, the oxygen content in the FOUP 101 may be gradually increased due to possible slight flow of the gas in the FOUP 101. Based on this, in a feasible embodiment, whether the oxygen content detected by the detecting assembly 203 is greater than the preset oxygen content threshold value C % is determined every a preset duration. Assuming that the oxygen content detected by the detecting assembly 203 at a moment t4 is greater than the preset oxygen content threshold value C % and lower than 10%, the inflating assembly 201 is controlled at the moment t4 to input the inert gas to the FOUP with a flow of 15 LPM.

Optionally, the preset threshold value of the oxygen content, i.e., C %<1%.

After inputting the inert gas to the FOUP by the inflating assembly 201, if at a moment t5, the oxygen content of the gas in the FOUP 101 detected by the detecting assembly 203 is lowered to be lower than the preset threshold value C % of the oxygen content again, the inflating assembly 201 is controlled by the controller 202 to stop inputting the inert gas to the FOUP 101. After that, the controller 202 continues to determine whether the oxygen content detected by the detecting assembly 203 is greater than the preset threshold value C % of the oxygen content every the preset duration.

In other words, in the embodiment of the disclosure, after the oxygen content of the gas in the FOUP 101 is adjusted to be lower than the preset threshold value C % of the oxygen content and the inert gas is stopped being input to the FOUP 101, whether the oxygen content detected by the detecting assembly 203 is greater than the preset threshold value C % of the oxygen content may be determined every the preset duration. If yes, the inflating assembly 201 is controlled to input the inert gas to the FOUP to lower the oxygen content of the gas in the FOUP 101. Therefore, it not only can guarantee that the oxygen content in the FOUP is lower than the preset threshold value of the oxygen content for a long time, but also reduce the waste of the inert gas, thereby lowering the production cost.

Based on the content described in the embodiment above, in another feasible embodiment of the disclosure, the controller 202 is further specifically configured as follows.

It monitors whether the oxygen content detected by the detecting assembly 203 is greater than the preset threshold value of the oxygen content in real time after controlling the inflating assembly 201 to stop inputting the inert gas to the FOUP 101. If yes, the inflating assembly 201 is controlled to input the inert gas to the FOUP according to the oxygen content detected by the detecting assembly 203.

In other words, in the embodiment of the disclosure, after the oxygen content of the gas in the FOUP 101 is adjusted to be lower than the preset threshold value C % of the oxygen content and the inert gas is stopped being input to the FOUP 101, whether the oxygen content detected by the detecting assembly 203 is greater than the preset oxygen content threshold value C % may be monitored in real time. If yes, the inflating assembly 201 is controlled to input the inert gas to the FOUP to lower the oxygen content of the gas in the FOUP 101. Therefore, it not only can guarantee that the oxygen content in the FOUP is lower than the preset threshold value of the oxygen content for a long time, but also reduce the waste of the inert gas, thereby lowering the production cost.

Figure 5:
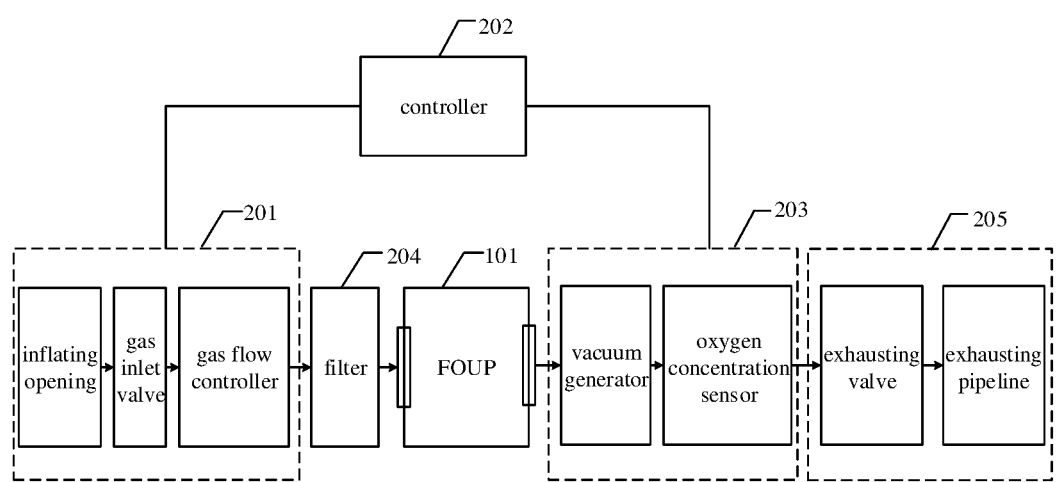
FIG. 5 schematically shows a structure of another system for adjusting an oxygen content in an FOUP provided by an embodiment of the disclosure.

Based on the content described in the embodiment above, referring to FIG. 5, it schematically shows the structure of another system for adjusting an oxygen content in an FOUP provided by an embodiment of the disclosure.

In some embodiments, the system for adjusting the oxygen content in the FOUP above further includes a filter 204. The filter 204 is arranged between the inflating assembly 201 and the gas inlet of the FOUP 101. The filter 204 is configured to filter the inert gas output from the inflating assembly, and may play a role in purifying the inert gas to avoid impurities inside a pipeline from polluting an internal environment of the FOUP 101.

The inflating assembly 201 includes an inflating inlet, a inlet valve and a gas flow controller. The inflating inlet is configured to output the inert gas. The inlet valve is arranged between the inflating inlet and the gas flow controller and configured to open or close the inflating inlet for the output of the inert gas. The gas flow controller is arranged between the inflating inlet and the filter 204 and configured to adjust a flow of the inert gas input to the FOUP 101 via the inflating inlet according to an adjusting instruction sent by the controller 202.

The detecting assembly 203 includes a vacuum generator and an oxygen concentration sensor. The vacuum generator is arranged between the gas outlet of the FOUP 101 and the oxygen concentration sensor, and is configured to draw out the gas in the FOUP 101 and transfer the drawn-out gas in the FOUP 101 to the oxygen concentration sensor. The oxygen concentration sensor is configured to detect an oxygen content in the gas transferred by the vacuum generator.

It can be understood that in some other embodiments of the disclosure, the oxygen concentration sensor may also be arranged between the gas outlet of the FOUP and the vacuum generator. In this case, the gas drawn out by the vacuum generator from the FOUP will first pass the oxygen concentration sensor in which the oxygen content of the gas drawn-out from the FOUP can be directly detected.

Optionally, in other embodiments, devices having a gas pumping function, such as a sucking pump, may also be adopted, which is not limited in the embodiment of the disclosure.

It can be understood that in some embodiments, the filter 204 may also be connected with a gas inlet pipe of an OverHead Buffer (OHB), and the detecting assembly 203 is connected with a gas outlet pipe of the OHB.

When the FOUP is temporarily stored on the OHB, the gas inlet pipe of the OHB corresponds to the gas inlet of the FOUP in position, and the gas outlet pipe of the OHB corresponds to the gas outlet of the FOUP in position. Therefore, the inert gas output from the filter 204 may flow into the gas inlet of the FOUP and then flow out from the gas outlet of the FOUP.

In some embodiments, the controller 202 is further configured to control the vacuum generator above to stop working after controlling the inflating assembly 201 to stop inputting the inert gas to the FOUP 101, so as to avoid that the inert gas in the FOUP 101 is totally drawn out.

In some embodiments, the system for adjusting the oxygen content in the FOUP further includes an exhausting assembly 205. The detecting assembly 203 is arranged between the gas outlet of the FOUP 101 and the exhausting assembly 205.

The exhausting assembly 205 includes an exhausting valve and an exhausting pipeline. The exhausting valve is configured to close the exhausting pipeline after the inflation assembly 201 stops inputting the inert gas to the FOUP 101 so as to avoid external air from flowing back into the FOUP 101 and lower the risk of being oxidized of the silicon wafers in the FOUP 101.

In the embodiment of the disclosure, the FOUP is subjected to gas drawing. The oxygen concentration sensor is configured to judge the oxygen content in the FOUP, then the flow of the inert gas to be input is determined according to the oxygen content in the FOUP, and the inert gas is input to the FOUP with the flow. In the process of inputting the inert gas to the FOUP, a feedback adjusting mechanism is adopted. That is, the controller adjusts the input flow of the inert gas in real time every a fixed time based on measurement results fed back by the oxygen concentration sensor, to achieve optimal control.

In other words, according to the system for adjusting the oxygen content in the FOUP provided by the embodiment of the disclosure, the flow of the inert gas input to the FOUP is not kept constant and is changed with the oxygen content of the gas in the FOUP. Therefore, it not only can effectively ensure that the oxygen content in the FOUP is lower than the safety value and can lower the risk of being oxidized of the silicon wafers in the FOUP, but also can reduce the waste of the inert gas and thus lower the production cost.

Based on the content described in the embodiment above, an embodiment of the disclosure further provides a method for adjusting an oxygen content in an FOUP. The method is applied to the system for adjusting the oxygen content in the FOUP described in the embodiment above. In a feasible embodiment, the method includes following operations.

At operation A, an oxygen content detected by a detecting assembly is obtained.

At operation B, a flow of an inert gas input from an inflating assembly to the FOUP is adjusted according to the oxygen content detected by the detecting assembly.

The inflating assembly is connected with a gas inlet of the FOUP and configured to input the inert gas to the FOUP. The detecting assembly is connected with a gas outlet of the FOUP and configured to detect the oxygen content of the gas in the FOUP.

In a feasible embodiment, the adjustment of the flow of the inert gas input from the inflating assembly to the FOUP includes following operations.

At operation A1, an oxygen content range in which the oxygen content detected by the detecting assembly falls is determined.

At operation A2, a target flow value of the inert gas input to the FOUP by the inflating assembly is determined according to the oxygen content range in which the oxygen content detected by the detecting assembly falls. Different oxygen content ranges correspond to different flow values.

At operation A3, the flow of the inert gas input to the FOUP by the inflating assembly is adjusted as the target flow value.

In another feasible embodiment, the adjustment of the flow of the inert gas input to the FOUP by the inflating assembly includes following operations.

At operation A1, whether the oxygen content detected by the detecting assembly is greater than a preset threshold value of the oxygen content is determined.

At operation A2, the flow of the inert gas input to the FOUP by the inflating assembly is adjusted as a preset fixed flow value when the oxygen content detected by the detecting assembly is greater than the preset threshold value of the oxygen content.

In some embodiments, after adjusting the flow of the inert gas input to the FOUP by the inflating assembly, the method further includes following operations.

The oxygen content detected by the detecting assembly is monitored. The inflating assembly is controlled to stop inputting the inert gas to the FOUP when the oxygen content detected by the detecting assembly is lower than or equal to the preset oxygen content threshold value.

In some embodiments, after controlling the inflating assembly to stop inputting the inert gas to the FOUP, the method further includes following operations.

Whether the oxygen content detected by the detecting assembly is greater than the preset threshold value of the oxygen content is determined every a preset duration. The inflating assembly is controlled to input the inert gas to the FOUP according to the oxygen content detected by the detecting assembly if the oxygen content detected by the detecting assembly is greater than the preset threshold value of the oxygen content.

In some embodiments, after controlling the inflating assembly to stop inputting the inert gas to the FOUP, the method further includes following operations.

Whether the oxygen content detected by the detecting assembly is greater than the preset threshold value of the oxygen content is monitored in real time. The inflating assembly is controlled to input the inert gas to the FOUP according to the oxygen content detected by the detecting assembly, if the oxygen content detected by the detecting assembly is greater than the preset threshold value of the oxygen content.

In some embodiments, the detecting assembly includes a vacuum generator. The vacuum generator is configured to draw out the gas from the FOUP. After the inflating assembly is controlled to stop inputting the inert gas to the FOUP, the method further includes controlling the vacuum generator to stop working.

Figure 6:
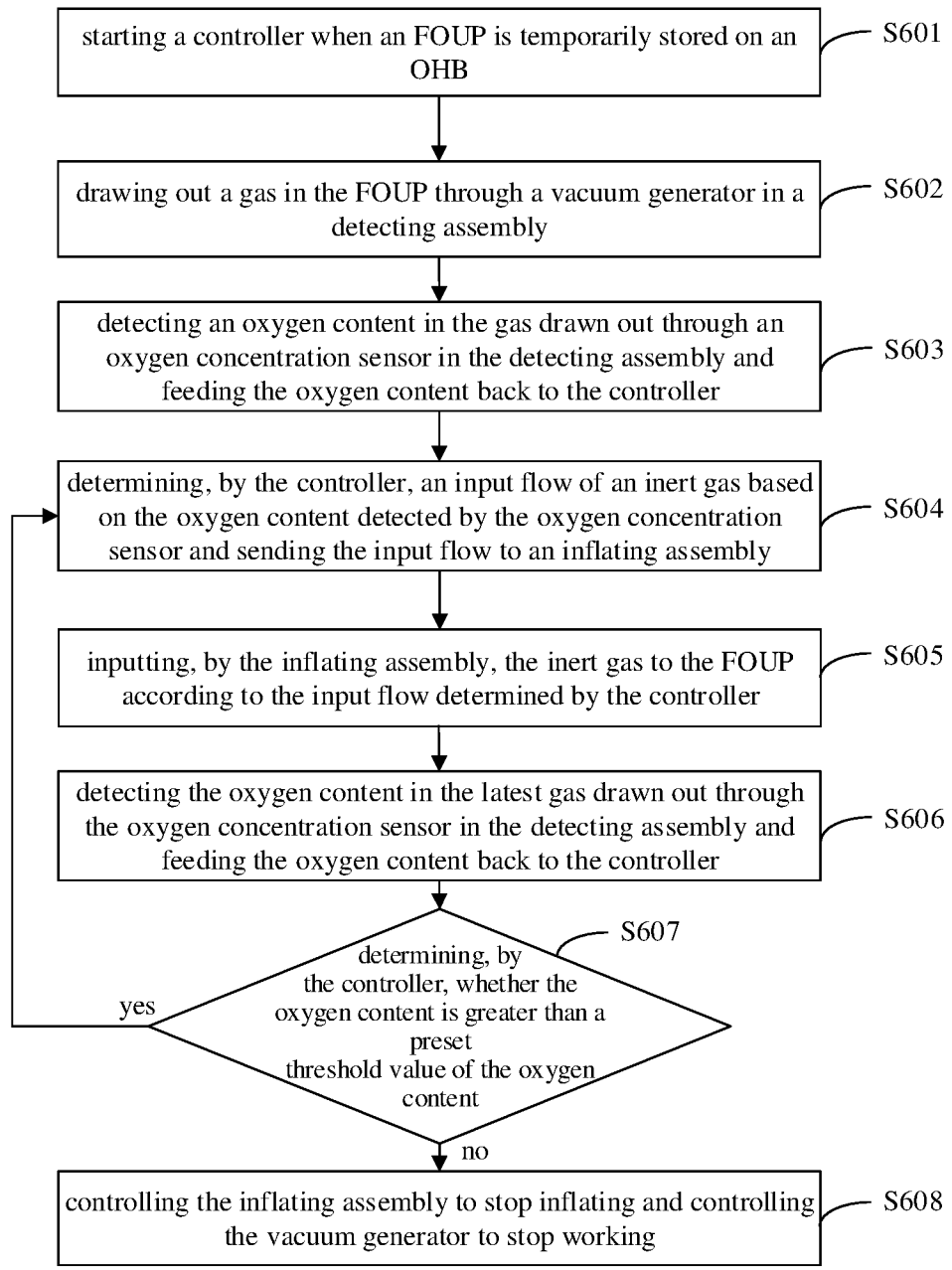
FIG. 6 schematically shows a flowchart of a method for adjusting an oxygen content in an FOUP provided by an embodiment of the disclosure.

For better understanding of the embodiment of the disclosure, referring to FIG. 6, it schematically shows a flowchart of the method for adjusting the oxygen content in the FOUP provided by the embodiment of the disclosure.

In a feasible embodiment, the method for adjusting the oxygen content in the FOUP above includes following operations.

At S601, the controller is started when the FOUP is temporarily stored on the OHB.

At S602, the gas in the FOUP is drawn out by the vacuum generator in the detecting assembly.

At S603, the oxygen content of the drawn-out gas is detected through the oxygen concentration sensor in the detecting assembly and fed back to the controller.

At S604, the input flow of the inert gas is determined by the controller based on the oxygen content detected by the oxygen concentration sensor and is sent to the inflating assembly.

At S605, the inert gas is input to the FOUP by the inflating assembly with the input flow determined by the controller.

At S606, the oxygen content of the drawn-out gas is detected by the oxygen concentration sensor in the detecting assembly and fed back to the controller.

At S607, whether the oxygen content in the FOUP is greater than the preset threshold value of the oxygen content is determined by the controller. If yes, S604 is executed again. If not, S608 continues to be executed.

At S608, the inflating assembly is controlled by the controller to stop inputting the inert gas to the FOUP and the vacuum generator is controlled to stop working.

According to the method for adjusting the oxygen content in the FOUP provided by the embodiment of the disclosure, the flow of the inert gas input to the FOUP is not kept constant and is changed with the oxygen content of the gas in the FOUP. Therefore, it not only can effectively ensure that the oxygen content in the FOUP is lower than a safety value and can lower the risk of being oxidized of silicon wafers in the FOUP, but also can reduce the waste of the inert gas and thus lower the production cost.

Figure 7:
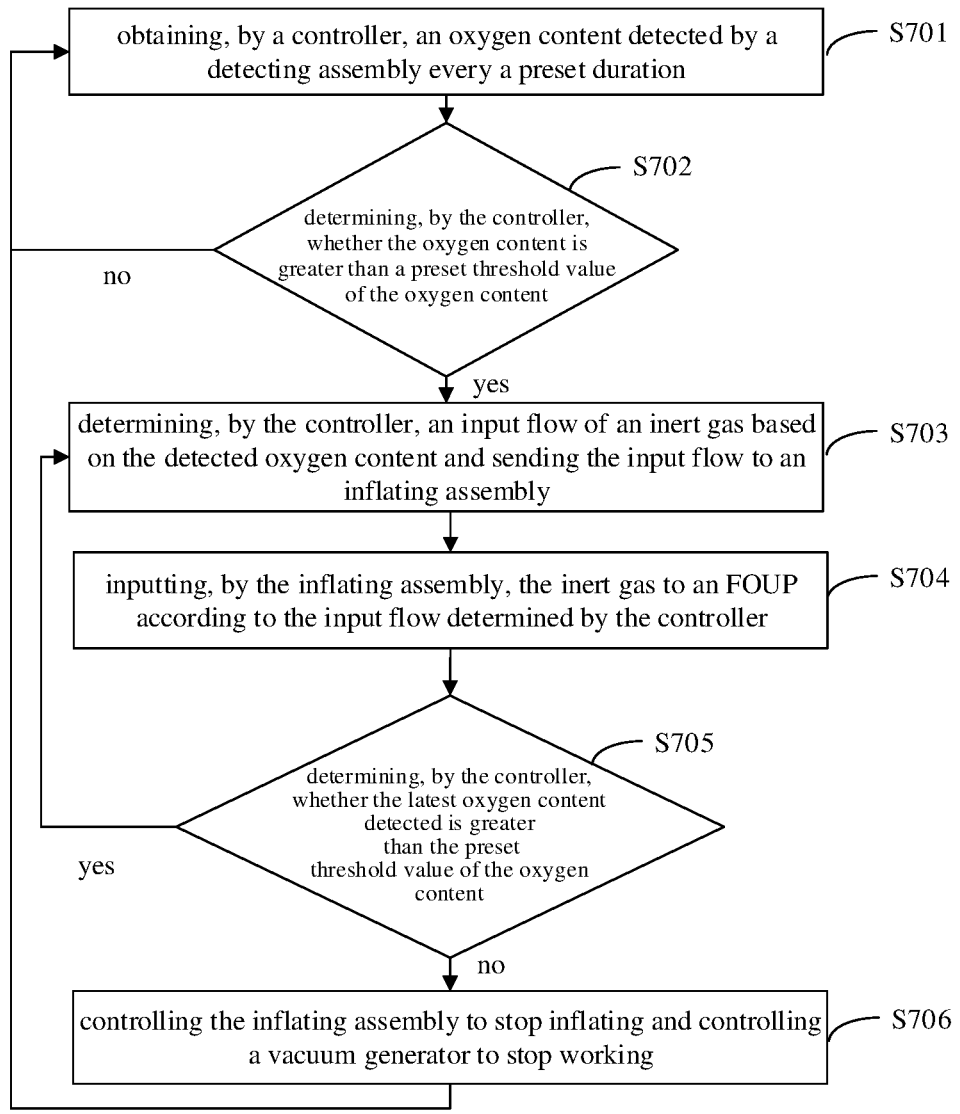
FIG. 7 schematically shows a flowchart of another method for adjusting an oxygen content in an FOUP provided by an embodiment of the disclosure.

Based on the content described in the embodiment above, for better understanding of the embodiment of the disclosure, referring to FIG. 7, it schematically shows a flowchart of another method for adjusting the oxygen content in the FOUP provided by the embodiment of the disclosure.

In some embodiments of the disclosure, after S608, the method may further include following operations.

At S701, the controller obtains the oxygen content detected by the detecting assembly every a preset duration.

At S702, whether the oxygen content is greater than the preset threshold value of the oxygen content is determined by the controller. If yes, S703 is executed. If not, S701 is executed again.

At S703, the input flow of the inert gas is determined by the controller based on the detected oxygen content and is sent to the inflating assembly.

At S704, the inert gas is input to the FOUP by the inflating assembly according to the input flow determined by the controller.

At S705, whether the latest oxygen content detected by the detecting assembly is greater than the preset oxygen content threshold value is determined by the controller. If not, S706 is executed. If yes, S703 is executed again.

At S706, the inflating assembly is controlled by the controller to stop inflating and the vacuum generator is controlled to stop working. Meanwhile, S701 continues to be executed again.

In other words, in the embodiment of the disclosure, after the oxygen content of the gas in the FOUP is adjusted to be lower than the preset threshold value C % of the oxygen content and the inert gas is stopped being input to the FOUP, whether the oxygen content detected by the detecting assembly is greater than the preset threshold value C % of the oxygen content may be determined every the preset duration. If yes, the inflating assembly is controlled to input the inert gas to the FOUP to lower the oxygen content of the gas in the FOUP. Therefore, it can not only ensure that the oxygen content in the FOUP is lower than the preset threshold value of the oxygen content for a long time, but also can reduce the waste of the inert gas and thus lower the production cost.

Based on the contents described in the above embodiments, an embodiment of the disclosure further provides a computer-readable storage medium. The computer-readable storage medium stores a computer-executable instruction. When executing the computer-executable instruction, a processor implements the operations of the method for adjusting the oxygen content in the FOUP described in the above embodiments.

In several embodiments provided by the disclosure, it should be understood that, the disclosed device and method may be implemented by other manners. For example, the device described in the above embodiment is only schematic. For example, the division of modules is only a logical function division. In actual implementations, there can be another division mode, for example, multiple modules can be combined or integrated into another system, or some features can be ignored or not executed. In addition, coupling or direct coupling or communication connection displayed or discussed may be indirect coupling or communication connection between apparatuses or modules through some interfaces, and may be electrical, mechanical, or other forms.

The modules described as separate components may or may not be physically separated, and the components displayed as modules may or may not be physical units. That is, they may be located in one place, or may be distributed to multiple network units. Part or all of the modules may be selected according to actual needs to implement the purpose of the solution of this embodiment.

In addition, each functional module in each embodiment of the disclosure can be integrated in one processing unit, each module can exist physically and separately, or two or more modules can be integrated in one unit. The units formed by the above modules can be implemented in the form of hardware or hardware plus software functional units.

The above integrated modules implemented in the form of software functional modules can be stored in a computer-readable storage medium. The above software functional modules are stored in a storage medium and include several instructions to enable a computer device (which can be a personal computer, server, network device, etc.) or processor to perform some operations of the method described in various embodiments of the disclosure.

It should be understood that the above processor may be a Central Processing Unit (CPU), or other general-purpose processors, Digital Signal Processors (DSP), Application Specific Integrated Circuits (ASIC), etc. The general-purpose processors may be microprocessors, or the processors may be any conventional processor and the like. Steps of the methods disclosed with reference to the disclosure may be directly performed and completed by a hardware processor, or may be performed and completed by using a combination of hardware and software modules in the processor.

The memory may be a high-speed Random Access Memory (RAM), and may also be a Non-Volatile Memory (NVM), for example, at least one disk memory, which may also be a USB disk, a removable hard disk, a read-only memory, a magnetic disk or optical disk, or the like.

A bus may be an Industry Standard Architecture (ISA) bus, a Peripheral Component Interconnect (PCI) bus or an Extended Industry Standard Architecture (EISA) bus, etc. The bus may be divided into an address bus, a data bus, a control bus, etc. For ease of representation, the bus in the drawings of the disclosure is not limited to only one bus or one type of bus.

The above storage medium may be implemented by using any type of volatile or non-volatile memory devices, or a combination thereof, such as a Static Random Access Memory (SRAM), an Electrically Erasable Programmable Read-Only Memory (EEPROM), an Erasable Programmable Read-Only Memory (EPROM), a Programmable Read-Only Memory (PROM), a Read-Only Memory (ROM), a magnetic memory, a flash memory, and a magnetic or optical disk. The storage medium may be any available medium capable of being accessed by a general-purpose or special-purpose computer.

An exemplary storage medium is coupled to a processor to enable the processor to read information from, and write information to, the storage medium. Of course, the storage medium may also be a component of the processor. The processor and the storage medium may be located in an Application Specific Integrated Circuit (ASIC). Of course, the processor and the storage medium may also exist in an electronic device or main control device as separate components.

Those of ordinary skill in the art may understand that hardware related to program instructions may be used to implement all or part of the steps of the method embodiment above. The aforementioned program may be stored in a computer-readable storage medium. When the program is executed, the steps of the method embodiment above are executed. The aforementioned storage medium includes various media that can store program codes, such as a ROM, a RAM, a magnetic disc, or optical disc.

Finally, it should be noted that the foregoing embodiments are merely intended for describing the technical solutions of the disclosure, but not for limiting the disclosure. Although the disclosure is described in detail with reference to the foregoing embodiments, persons of ordinary skill in the art should understand that they may still make modifications to the technical solutions described in the foregoing embodiments or make equivalent replacements to some or all technical features thereof, without making the essence of the corresponding technical solutions depart from the scope of the technical solutions of the embodiments of the disclosure.

The invention claimed is:

1. A system for adjusting an oxygen content in a Front Opening Unified Pod (FOUP), comprising:
    an inflating assembly, the FOUP, a controller and a detecting assembly;
    wherein the inflating assembly is connected with a gas inlet of the FOUP and configured to input an inert gas to the FOUP;
    the detecting assembly is connected with a gas outlet of the FOUP and configured to detect the oxygen content of the gas in the FOUP;
    the inflating assembly and the detecting assembly are both connected with the controller;
    the controller is configured to:
    obtain the oxygen content detected by the detecting assembly;
    determine whether the oxygen content detected by the detecting assembly is greater than a preset oxygen content threshold value;
    adjust the flow of the inert gas input from the inflating assembly to the FOUP as a preset fixed flow value when the oxygen content detected by the detecting assembly is greater than the preset oxygen content threshold value;
    when the oxygen content in the FOUP is in a first range, the inflating assembly is controlled by the controller to continuously input the inert gas to the FOUP at a first gas flow rate;

when the oxygen content in the FOUP is in a second range, the inflating assembly is controlled by the controller to continuously input the inert gas to the FOUP at a second gas flow rate;

when the oxygen content in the FOUP is in a third range, the inflating assembly is controlled by the controller to continuously input the inert gas to the FOUP at a third gas flow rate;

when the oxygen content in FOUP is lower than or equal to the preset oxygen content threshold, the inflating assembly is controlled by the controller to stop inputting the inert gas to the FOUP; and the oxygen content of the first range >the oxygen content of the second range >the oxygen content of the third range; the first gas flow rate >the second gas flow rate >the third gas flow rate.

2. The system of claim 1, wherein the controller is further specifically configured to, determine whether the oxygen content detected by the detecting assembly is greater than the preset oxygen content threshold value every a preset duration after controlling the inflating assembly to stop inputting the inert gas to the FOUP; and control the inflating assembly to input the inert gas to the FOUP according to the oxygen content detected by the detecting assembly if the oxygen content detected by the detecting assembly is greater than the preset oxygen content threshold value.

3. The system of claim 1, wherein the controller is further specifically configured to, monitor whether the oxygen content detected by the detecting assembly is greater than the preset oxygen content threshold value in real time after controlling the inflating assembly to stop inputting the inert gas to the FOUP; and control the inflating assembly to input the inert gas to the FOUP according to the oxygen content detected by the detecting assembly if the oxygen content detected by the detecting assembly is greater than the preset oxygen content threshold value.

4. The system of claim 1, further comprising a filter, located between the inflating assembly and the gas inlet of the FOUP; wherein the filter is configured to filter the inert gas output from the inflating assembly.

5. The system of claim 1, wherein the inflating assembly comprises an inflation opening and a gas flow controller, and the gas flow controller is located between the inflation opening and the gas inlet of the FOUP; and the inflation opening is configured to output the inert gas, and the gas flow controller is configured to adjust the flow of the inert gas input from the inflation opening to the FOUP according to an adjusting instruction sent by the controller.

6. The system of claim 5, wherein the inflating assembly further comprises a gas inlet valve, located between the inflation opening and the gas flow controller.

7. The system of claim 1, wherein the detecting assembly comprises a vacuum generator and an oxygen concentration sensor, and the vacuum generator is located between the gas outlet of the FOUP and the oxygen concentration sensor;

the vacuum generator is configured to draw out the gas in the FOUP and transfer the drawn-out gas in the FOUP to the oxygen concentration sensor; and the oxygen concentration sensor is configured to detect an oxygen content in the gas transferred by the vacuum generator.

8. The system of claim 1, wherein the detecting assembly comprises a vacuum generator and an oxygen concentration sensor, and the oxygen concentration sensor is located between the gas outlet of the FOUP and the vacuum generator; and the vacuum generator is configured to draw out the gas in the FOUP, and the oxygen concentration sensor is configured to detect an oxygen content in the gas drawn-out from the FOUP.

9. The system of claim 7, wherein the controller is further configured to, control the vacuum generator to stop working after controlling the inflating assembly to stop inputting the inert gas to the FOUP.

10. The system of claim 1, further comprising an exhausting assembly, wherein the detecting assembly is located between the gas outlet of the FOUP and the exhausting assembly, and the exhausting assembly comprises an exhausting valve and an exhausting pipeline.

* * * * *